(12) United States Patent
Kitagawa et al.

(10) Patent No.: US 7,492,157 B2
(45) Date of Patent: Feb. 17, 2009

(54) APPARATUS OF NUCLEAR MAGNETIC RESONANCE MEASUREMENT BY USING CIRCULATION FLOW FOR SAMPLE CONDITION CONTROL

(75) Inventors: Isao Kitagawa, Kokubunji (JP);
Michiya Okada, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/940,398

(22) Filed: Nov. 15, 2007

(65) Prior Publication Data
US 2008/0174312 A1 Jul. 24, 2008

(30) Foreign Application Priority Data
Nov. 17, 2006 (JP) .............................. 2006-311380

(51) Int. Cl.
*G01V 3/00* (2006.01)
(52) U.S. Cl. ...................................... 324/318; 324/321
(58) Field of Classification Search ......... 324/300–322; 600/407–422
See application file for complete search history.

(56) References Cited
U.S. PATENT DOCUMENTS
3,547,587 A * 12/1970 Innes .......................... 436/134

6,319,894 B1 * 11/2001 Tracey et al. .................. 514/8
7,157,699 B2 * 1/2007 Ouyang et al. ............... 250/281

FOREIGN PATENT DOCUMENTS

| JP | 2003-510608 | 3/2003 |
| JP | 2004-534958 | 11/2004 |
| WO | WO 01/23889 A1 | 4/2001 |
| WO | WO 03/007009 A2 | 1/2003 |

* cited by examiner

*Primary Examiner*—Brij B Shrivastav
(74) *Attorney, Agent, or Firm*—Antonelli, Terry, Stout & Kraus, LLP.

(57) ABSTRACT

The present invention makes it possible to measure a plurality of samples under a certain concentration condition of the small molecule by the circulation transfer of a small molecule solution through a small molecule concentration control portion for injecting, discharging or feeding the small molecule solution, a mixing filter portion for mixing a solution (sample) containing the large molecule sample with the small molecule solution, a container set in a nuclear magnetic resonance probe, a separating filter portion for separating the mixture into the sample and the small molecule solution, and the small molecule concentration control portion; injecting the sample from the mixing filter portion; holding the sample in a measurement portion in the container; and discharging the sample from the separating filter portion after completion of the NMR measurement.

15 Claims, 10 Drawing Sheets

APPARATUS OF NUCLEAR MAGNETIC RESONANCE MEASUREMENT BY USING CIRCULATION FLOW FOR SAMPLE CONDITION CONTROL

CLAIM OF PRIORITY

The present application claims priority from Japanese application JP 2006-311380, filed on Nov. 17, 2006, the content of which is hereby incorporated by reference into this application.

BACKGROUND OF THE INVENTION (1) Field of the Invention

The present invention relates to an NMR (nuclear magnetic resonance) apparatus, in particular, to an apparatus of nuclear magnetic resonance measurement by using circulation flow for sample condition control which apparatus is for carrying out measurement repeatedly while changing the measuring conditions of a sample in the NMR apparatus.

(2) Description of the Related Arts

Molecules such as proteins having certain functions within a living body have a larger molecular weight than that of compounds used for medicines or the like and have properties as a large molecule.

Large molecules typified by proteins have a molecular function in a solution thereof and this function is inhibited or accelerated when they bind to a certain small molecule. There are many methods for detecting binding of a large molecule to a certain small molecule or interaction therebetween. In particular, in measurement (which will hereinafter be called "NMR measurement") utilizing nuclear magnetic resonance permitting direct observation of the information of a molecular structure of the large molecule or small molecule, it is possible to analyze, from a change in the measurement spectrum of the concentration of the molecule, not only a dissociation constant between the large molecule and low molecule or reaction rate of them but also interaction of them based on the structure of the molecules. Refer to, for example, the description in International Publication No. WO01/023889 (Japanese Patent Application No. 2001-527224) with regard to a method of measuring the interaction between a protein and a low molecule by means of NMR.

Of large molecules to be used for NMR measurement, proteins are produced, for example, by extraction from naturally occurring living organisms, extraction from an abundant expression system making use of *Escherichia coli* or the like having, incorporated therein, a gene related to the formation of a protein, or by a method utilizing a non-cell expression system causing abundant expression of a protein without using a living cell. Labeling of hydrogen, carbon and nitrogen, which are main elements constituting a protein, with a radioisotope is sometimes carried out. This labeling includes labeling of a combination of three elements, that is, hydrogen, carbon and nitrogen constituting a protein, comprehensive labeling method for labeling all them, and selective labeling method of labeling only atoms belonging to a specific amino acid residue. In any method, a labeling cost is high.

A nuclear magnetic resonance spectrometer (which will hereinafter be called NMR apparatus) has typically a magnet for causing a magnetostatic field $B_0$ and a nuclear magnetic resonance probe located at a bore portion inside of this magnet. This nuclear magnetic resonance probe includes at least one coil for applying an RF magnetic field $B_1$ to a sample of interest and detecting reaction (response) of the sample to the magnetic field thus applied.

Conventional nuclear magnetic resonance probes include probes for the static setting sample and flow through probes. In probes for the static setting sample, the sample is put in a glass tube or ampoule (which will hereinafter be called "sample tube") and measurement is started after setting this sample tube at a predetermined position of the NMR apparatus.

In conventional probes for the static setting sample, a change in the NMR spectrum due to an increase in the concentration can be observed by carrying out NMR measurement while titrating a small molecule in a sample tube having an opening portion.

Conventional flow through probes each has a sample inlet, a sample outlet, and an internal tubular portion extending between the inlet and outlet. The internal tubular portion includes a cell for retaining a sample therein. The sample is put in this probe from the sample inlet, flows in the internal tubular portion, and enters the cell. After measurement, it flows in the tubular portion and is discharged out of the probe.

A combination of the conventional flow through probe and a robot-using sample transfer system has been used. Various sample transfer systems are employed for this combination and one of them is commercially available from Gilson, Inc. In such a system, samples adjusted for a plurality of measurement conditions must be prepared and put in a plurality of containers in advance, respectively. The samples are each fed to a predetermined flow through probe after passing through an apparatus capable of taking it out from the container. Each sample is discharged out of the probe after completion of the NMR measurement. Refer to International Publication No. WO2003/007009 (Japanese Unexamined Patent Application Publication No. 2004-534958) with regard to a preferred conventional system for transferring the sample to the probe.

SUMMARY OF THE INVENTION

The conventional probe for the static setting sample however has a difficulty in carrying out NMR measurement of a sample solution, which contains a small molecule at a concentration increased to a certain level, under the condition of a concentration less than the certain level because the sample solution is a mixture of a large molecule, a small molecule for evaluating its effect as a drug, and other reagents.

Titration of a small molecule in a sample tube typically used for NMR measurement causes an increase in the volume of the whole sample solution, a change in the concentration of a large molecule sample and a change in the liquid level of the sample solution. The titration volume relative to the volume of the sample solution must therefore be decreased as much as possible in order to suppress these changes.

The concentration of a small molecule to be titrated must be decreased in order to reduce the titration volume. The upper limit of the concentration of the solution to be titrated is determined, depending on the solubility of the small molecule. The solubility of a substance typically differs greatly with a kind or temperature of a solvent. Accordingly, in the NMR measurement in which the concentration of a small molecule is changed by titration, a difference in the kind of the solvent or temperature has an influence on the stability of the concentration of a large molecule.

In the combination of the conventional flow through probe and sample transfer system, samples different in concentrations must be prepared in advance. Large molecule solutions adjusted to respective predetermined concentrations must be prepared as many as the number of measurement conditions so that preparation of samples costs much.

Large molecules or small molecules whose measurement condition range is unknown also pose the problem that measurement for functional evaluation must be carried out in repetition until a preferred measurement condition range or degree of change in condition is established.

An object of the present invention is therefore to provide an apparatus and a method for carrying out nuclear magnetic resonance measurement using a solution sample containing a large molecule such as protein and a small molecule while efficiently exchange the large molecule; and an apparatus for carrying out measurement in repetition while stably controlling the concentration condition of the sample and changing the concentration of the small molecule.

The present invention makes it possible to measure a plurality of samples under a certain concentration condition of a small molecule by circularly transferring a small molecule solution from a small molecule concentration control portion 30 which injects, discharges or feeds the small molecule solution, a mixing filter portion 32 for mixing a solution (sample) containing a large molecule sample with the small molecule solution, a container 10 set in a nuclear magnetic resonance probe 24, a separating filter portion 34 for separation for separating the mixture into the sample and the small molecule solution and then the control portion 30 again; injecting the sample from the mixing filter portion 32, retaining the sample in a measurement portion of the container 10, and discharging the sample from the separating filter portion 34 after completion of the NMR measurement.

To enable circulation transfer of the small molecule solution through the control portion 30, mixing filter portion 32, container 10 and separating filter portion 34, an injection port 14 of the container 10 set in the nuclear magnetic resonance probe 24 is connected to a first sample transfer tubing $16_1$, a discharge port 12 of the container is connected to a second sample transfer tubing $16_2$, the first sample transfer tubing $16_1$ is connected to a discharge port 50 of the mixing filter portion 32 (equipped with a small molecule injection port 51, a sample solution injection port 52 and the discharge port 50), a first small molecule solution transfer tubing $18_1$ is connected to the small molecule injection port 51 of the mixing filter portion 32, an injection port 60 of the separating filter portion 34 (equipped with a small molecule solution discharge port 61, a sample discharge port 62, and the injection port 60) is connected to the second sample transfer tubing $16_2$, a second small molecule solution transfer tubing $18_2$ is connected to the small molecule discharge port 61 of the separating filter portion 34, the second small molecule solution transfer tubing $18_2$ is connected to an injection port 40 of the small molecule concentration control portion 30 (having the injection port 40 and a discharge port 42 of the small molecule solution), and the first small molecule solution transfer tubing $18_1$ is connected to the discharge port 42.

In the small molecule concentration control portion 30, the injection port 40 of the small molecule concentration control portion is connected to a small molecule solution injection portion 70, discharge valve 44, injection valve 46, feed pump 48, pressure gauge 49 and discharge port 42 of the small molecule concentration control portion. The small molecule solution injection portion 70 is composed of one or more syringe pumps and an electronic apparatus for controlling it (them). The feed pump 48 is composed of a pump for feeding the solution under pressure and an electronic apparatus for controlling the feed pump.

The feed pump continuously pushes out the solution in an amount corresponding to a total volume of the sample passing regions of the container 10 set in the probe 24, sample transfer tubings $16_1$, $16_2$, $18_1$ and $18_2$, filter portions 32 and 34 and control portion 30 so that the solution passes through the container 10 set in the probe 24 and reaches the input side of the feed pump 48. This enables circulation transfer of the solution. After the solution is filled in the container 10 set in the probe 24 and reaches the input side of the feed pump 48, a constant volume of the solution always fills the container therewith.

(Injection of Buffer Solution)

The operation of the feed pump 48 is started and a buffer solution is introduced from the injection valve 46. The buffer solution is fed to the mixing filter portion 32 after passing through the first small molecule solution transfer tubing $18_1$. In the mixing filter portion 32, the buffer solution passes through portions $55_1$ and $55_2$ through which only a small molecule solution passes and hollow filters $54_1$ and $54_2$, reaches a portion 56 through which a mixed solution passes, is discharged from the discharge port 50, and reaches the container 10 after passing through the first sample transfer tubing $16_1$. Then, the buffer solution passes through the second sample transfer tubing $16_2$, separating filter portion 34, and second small molecule solution transfer tubing $18_2$ and reaches the input side of the feed pump 48 of the control portion 30.

(Injection of Small Molecule)

At the time of the injection of the small molecule, a flow of a solution is formed in a transfer tubing by circulating a solution by means of the feed pump 48. A small molecule solution for injection is set in the small molecule solution injection portion 70 in advance and the solution is injected in an amount determined by a measurer. The solution thus injected reaches the feed pump 48 with the flow and fed to the mixing filter portion 32 via the first small molecule solution transfer tubing $18_1$.

In the mixing filter portion 32, the solution is fed from the small molecule solution injection port to the portions $55_1$ and $55_2$ through which only a small molecule solution passes, passes through the hollow filters $54_1$ and $54_2$, and reaches the portion 56 through which a mixed solution passes. When only the small molecule solution is injected, only the small molecule solution is present in the portion 56 through which a mixed solution passes. The solution discharged from the discharge port 50 reaches the container 10 after passing through the first sample transfer tubing $16_1$.

Simultaneously with the injection, an excess solution appears. The discharge valve 44 is opened and the excess solution is discharged therefrom. With the completion of the discharge of the excess solution, the pressure indicated by a pressure gauge returns to that at the time of circulation feeding. After returning of the pressure is confirmed, the discharge valve 44 is closed, followed by steady circulation feeding.

At this time, the small molecule has an increased concentration in the sample passing regions of the container 10 set in the probe 24, sample transfer tubings $16_1$, $16_2$, $18_1$ and $18_2$, filter portions 32 and 34 and control portion 30.

The concentration of the small molecule in the sample solution to be used for the NMR measurement can be increased by performing the injection operation of the small molecule in plural times. Supposing that a total volume of the sample passing regions of the container 10 set in the probe 24, sample transfer tubings $16_1$, $16_2$, $18_1$ and $18_2$, filter portions 32 and 34 and control portion 30 is V, a concentration of the small molecule present in the volume V before all the injection operations is $\alpha$, a concentration of the small molecule to be injected is $\beta$, a volume per single injection operation is v, an amount of the small molecule discharged from the filter portion by the i-th injection operation is E(i), an amount of the small molecule which has remained after the injection operation is M(i), and an average concentration is δ(i), a discharged amount E(1) of the small molecule, a remaining amount M(1) of the small molecule and an average concentration δ(1) after the first injection operation can be determined based on the following equations, respectively.

[Equation 1]

$$E(1) = \alpha \times v \quad (1)$$

[Equation 2]

$$M(1) = \alpha \times (V - v) + \beta \times v \quad (2)$$

[Equation 3]

$$\delta(1) = \frac{M(1)}{V} \quad (3)$$

After the injection operation of the small molecule is performed i times, an amount E(i) of the small molecule, a remaining amount M(i) of the small molecule and an average concentration δ(i) can be determined based on the following equations, respectively.

[Equation 4]

$$E(i) = \delta(i-1) \times v \quad (4)$$

[Equation 5]

$$M(i) = \delta(i-1) \times (V - v) + \beta \times v \quad (5)$$

[Equation 6]

$$\delta(i) = \frac{M(i)}{V} \quad (6)$$

(Dilution of Small Molecule)

The small molecule is diluted using, as a solution to be injected, a small-molecule-free solvent in a similar manner to that employed for the injection of the small molecule. At the time of injecting the small-molecule-free solution, a solution flow is formed in the transfer tubing by the circulation of the solution by means of the feed pump 48. The small-molecule-free solution for injection is set in advance in the small molecule solution injection portion 70 and the solution is injected in only a volume predetermined by a measurer. The solution thus injected reaches the feed pump 48, passes through the first small molecule solution transfer tubing 18₁ and is fed to the mixing filter portion 32.

In the mixing filter portion 32, the solution is fed from the small molecule solution injection port to the portions 55₁ and 55₂ through which only a small molecule solution passes and after passing through the hollow filters 54₁ and 54₂, it reaches the portion 56 through which a mixed solution passes. The solution discharged from the discharge port 50 passes through the first sample transfer tubing 16₁ and reaches the container 10.

Appearance of an excess solution, which has occurred simultaneously with the injection, raises the pressure in the whole sample passing region. A pressure increase which has started from the circulation feeding of the solution by injection is confirmed by the pressure gauge 49 and the excess solution is discharged from the discharge valve 44 opened. When the discharge of the excess solution is completed, the pressure indicated by the pressure gauge returns to that at the time of circulation feeding. After confirmation of the returning of the pressure, the discharge valve 44 is closed to start steady circulation feeding again.

At this time, in the sample passing regions of the container 10 set in the probe 24, sample transfer tubings 16₁, 16₂, 18₁ and 18₂, filter portions 32 and 34, and control portion 30, the small molecule has a reduced concentration. The concentration of the small molecule in the sample solution to be used for NMR can be reduced by repetition of the above-described injection operations.

Supposing that a total volume of the sample passing regions of the container 10 set in the probe 24, sample transfer tubings 16₁, 16₂, 18₁ and 18₂, filter portions 32 and 34 and control portion 30 is V; a concentration of the small molecule before dilution is δ(0), a volume of the small-molecule-free solution per single injection operation is v, an amount of the small molecule discharged from the filter portion by the i-th injection operation is E(i), an amount of the small molecule which has remained after the injection operation is M(i), and an average concentration is δ(i), an amount E(1) of the small molecule discharged, a remaining amount M(1) of the small molecule and an average concentration δ(1) after first injection operation are determined based on the following equations, respectively.

[Equation 7]

$$E(1) = \delta(0) \times v \quad (7)$$

[Equation 8]

$$M(1) = \delta(0) \times V - E(1) \quad (8)$$

[Equation 9]

$$\delta(1) = \frac{M(1)}{V}. \quad (9)$$

An amount E(i) of the small molecule discharged, remaining amount M(i) of the small molecule and average concentration δ(i) after repetition of the diluting operation i times are determined based on the following equations, respectively.

[Equation 10]

$$E(i) = \delta(i-1) \times v \quad (10)$$

[Equation 11]

$$M(i) = M(i-1) - E(i) \quad (11)$$

[Equation 12]

$$\delta(i) = \frac{M(i)}{V}. \quad (12)$$

By using the above-described procedures in combination, it is possible to increase or decrease the concentration of the small molecule in the container 10 and to change the concentration of the small molecule again after NMR measurement. In addition, repetition of them makes it possible to carry out a series of NMR measurements while changing the concentration of the small molecule.

(Injection of Sample Solution)

By starting the operation of the feed pump 48, a fixed flow is generated throughout the circulation routes of the container 10 set in the probe 24, sample transfer tubings $16_1$, $16_2$, $18_1$ and $18_2$, filter portions 32 and 34, and control portion 30. A sample solution obtained by incorporating a large molecule in a solvent suited for the large molecule is injected from a sample solution injection portion 90. In the portion 56 through which a mixed solution passes, the small molecule solution which has already been present there is mixed with the large molecule solution. The injection raises the pressure of the solution, but the hollow filters $54_1$ and $54_2$ do not pass the large molecule therethrough so that the solution containing the large molecule transfers, with the fixed flow, to the container 10 set in the probe. Since the container 10 has an inner diameter larger than that of the sample transfer tubings $16_1$ and $16_2$, the solution which has passed the sample transfer tubing $16_2$ is mixed further in the container 10.

(Holding of Sample Solution)

When the mixed solution containing the large molecule reaches the container 10 and fills it therewith, the feed pump 48 stops its operation. By the termination of the pump, the pressure acting on the solution decreases and the circulation flow of the solution stops. The container 10 has an inner diameter larger than that of the sample transfer tubings $16_1$ and $16_2$, which disturbs smooth flow of the solution through the sample transfer tubings $16_1$ and $16_2$. The solution in the container 10 is therefore retained therein after the termination of the pump.

(NMR Measurement)

After the sample solution containing the large molecule is filled in the container set in the probe, NMR measurement of the sample is performed while applying a uniform magnetostatic field to the sample from the magnet.

(Discharge of Sample Solution)

By starting the operation of the feed pump 48, a fixed flow is generated throughout the circulation routes of the container 10 set in the probe 24, sample transfer tubings $16_1$, $16_2$, $18_1$ and $18_2$, filter portions 32 and 34, and the control portion 30. By the fixed flow thus formed, the mixed solution retained in the container 10 passes through the sample transfer tubing $16_2$ and reaches the filter portion 34. The small molecule solution which has passed through the portion 66 through which a mixed solution passes and then hollow filters $64_1$ and $64_2$, passes through the 61, and is discharged to the $18_2$. The solution containing the large molecule transfers from the sample discharge port 62 to a sample discharge syringe 91.

The present invention makes it possible to efficiently carry out NMR measurement of a plurality of large molecules by using a small molecule having a predetermined concentration and a large molecule.

The present invention also makes it possible to carry out selection, from a group of large molecules, of a specific large molecule which binds to a small molecule more efficiently by NMR measurement.

The present invention also makes it possible to efficiently determine, based on NMR measurement, the conditions of a small molecule solution causing a change in the properties of a large molecule in a mixed solution.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Examples of the present invention will hereinafter be described specifically based on accompanying drawings.

EXAMPLE 1

The circulation flow constitution of a sample solution in NMR measurement according to the present invention and preferred embodiments of its method will next be described referring to some drawings.

Figure 1:
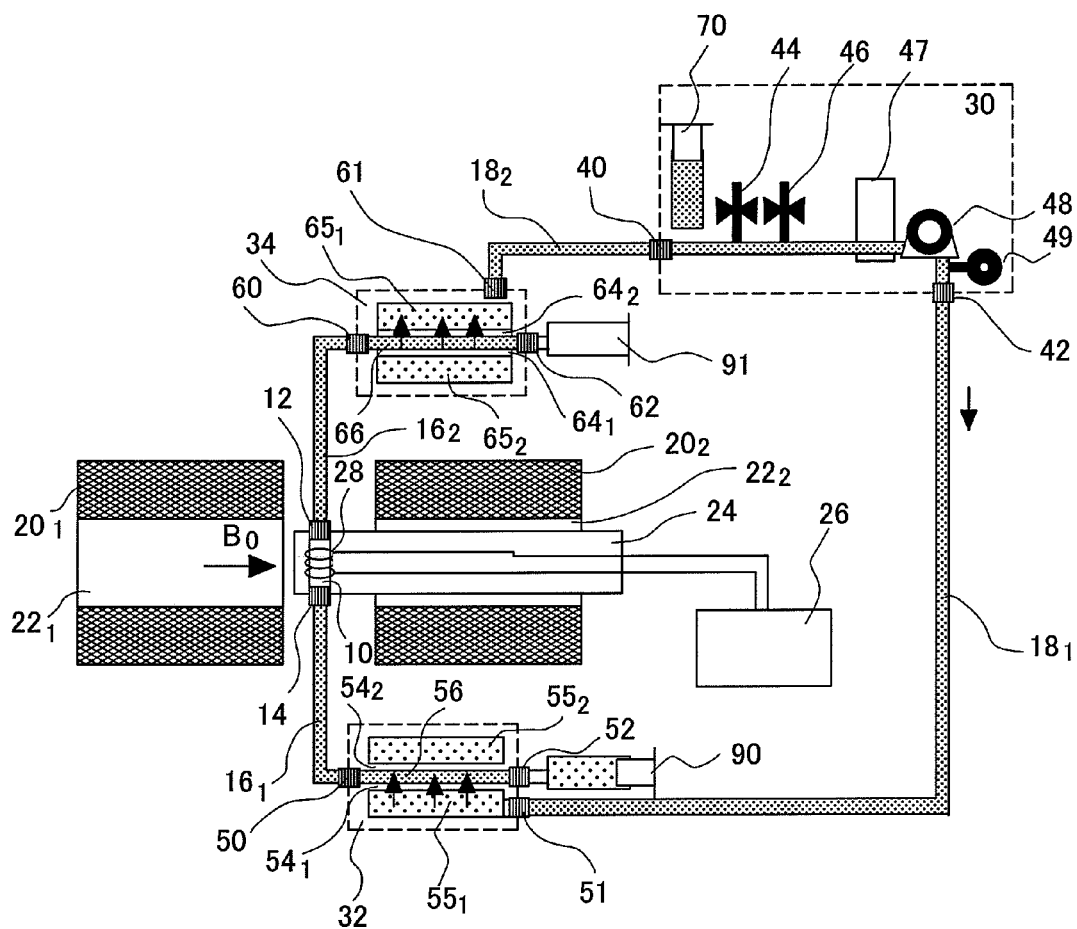
FIG. 1 is a schematic view of a circulation flow NMR apparatus according to a preferred embodiment of the present invention.

As illustrated in FIG. 1, a nuclear magnetic resonance probe 24 is fixed in bores $22_1$ and $22_2$ placed inside of magnets $20_1$ and $20_2$ for applying a magnetic field to a sample. A container 10 for retaining a certain amount of the sample is set in the nuclear magnetic resonance probe 24 in the optimum positional relationship with a probe coil 28 for detecting a nuclear magnetic resonance signal. In general, the container 10 is preferably made of a glass. The container 10 is connected to a second sample transfer tubing $16_2$ via a discharge port 12. The container 10 is connected to a first sample transfer tubing $16_1$ via an injection port 14.

In this Example, the container 10, discharge port 12, first sample transfer tubing $16_1$, injection port 14 and second sample transfer tubing $16_2$ are connected on the same axis inside the bores $22_1$ and $22_2$.

The second sample transfer tubing $16_2$ is connected to a separating filter portion 34. The separating filter portion 34 has an injection port 60, small molecule solution discharge port 61, sample discharge port 62, hollow filter substances 64$_1$ and 64$_2$, portions 65$_1$ and 65$_2$ through which only a small molecule solution passes, and a portion 66 through which a mixed solution passes.

A solution injected from the injection port 60 is brought into contact with the hollow filter substances 64$_1$ and 64$_2$ at the portion 66 through which a mixed solution passes. The hollow filter substances disturb the passage of a large molecule so that no large molecule is present in the portions 65$_1$ and 65$_2$. A solution containing the large molecule can be discharged from the sample discharge port 62 connected to the portion 66. A solution containing the small molecule is discharged from the small molecule solution discharge port 61 connected to the portions 65$_1$ and 65$_2$.

Although no particular limitation is imposed on the hollow filter substances 64$_1$ and 64$_2$ insofar as they can separate large molecules such as protein from the other substances, use of a hollow substance with pores having a diameter small enough to inhibit the passage of the protein but large enough to permit passage of the other components including small molecules is preferred.

The small molecule solution discharge port 61 of the separating filter portion is connected to an injection port 40 of a control portion 30 via a second small molecule solution transfer tubing 18$_2$.

In the control portion 30, the injection port 40 is connected to a small molecule solution injection portion 70, discharge valve 44, injection valve 46, feed pump 48, pressure gauge 49 and discharge port 42 of the small molecule concentration control portion;

the small molecule solution injection portion 70 has one or more syringe pumps and an electronic appliance for controlling the syringe pump(s); and the feed pump 48 has a pump of feeding a solution by application of a pressure and an electronic appliance for controlling the feed pump.

In the small molecule solution injection portion 70, one or more pressurized syringe pumps are preferably controlled electronically. For example, use of a syringe pump "KDS200", product of Kd Scientific, makes it possible to carry out an injection operation of a solution into a circulation route while precisely controlling the syringe containing the solution.

As the feed pump 48, those typically used in high performance liquid chromatography (which will hereinafter be abbreviated as HPLC) are preferred. A feed pump which drives a plunger to feed a liquid under a constant pressure by means of an electronically controllable stepping motor or the like is desirable.

The discharge port 42 of the control portion 30 is connected to a small molecule solution injection port 51 of a mixing filter portion 32 via a first small molecule solution transfer tubing 18$_1$.

The mixing filter portion 32 has a discharge port 50, small molecule solution injection port 51, sample solution injection port 52, hollow filters 54$_1$ and 54$_2$, portions 55$_1$ and 55$_2$ through which only a small molecule solution passes, and a portion 56 through which a mixed solution passes.

A solution injected from the small molecule solution injection port 51 is brought into contact with the hollow filters 54$_1$ and 54$_2$ at the portions 55$_1$ and 55$_2$. A sample solution containing the large molecule is injected from the sample solution injection port 52. The hollow filter substances hinder the passage of the large molecule so that the large molecule is not transferred to the side of the portions 55$_1$ and 55$_2$. The solution containing the large molecule is mixed with the small molecule solution and discharged from the discharge port 50 connected to the portion 56.

Although no particular limitation is imposed on the hollow filters 54$_1$ and 54$_2$ insofar as they can separate a large molecule such as protein from the other components, a hollow substance with pores having a diameter small enough to prevent the passage of protein but large enough to permit passage of the other components including a small molecule.

The material of the sample transfer tubing 16$_1$, 16$_2$, 18$_1$, and 18$_2$ must be selected depending on the properties of the sample solution. Polyethylene ethylene ketone (PEEK), Tefzel, Kel-F, fused silica and the like are often employed in the measurement of a bio-related large molecule such as protein. The sample transfer tubing has an inner diameter of preferably from 0.5 mm to 0.065 mm.

The container 10 must reserve therein a sufficient amount of a sample for NMR measurement. When protein is employed as the large molecule, the amount of the sample is from 400 μL to 100 μL.

When the probe has improved detection sensitivity and magnetic field can be kept uniform, even 100 μL or less is sufficient for measurement.

Figure 2:
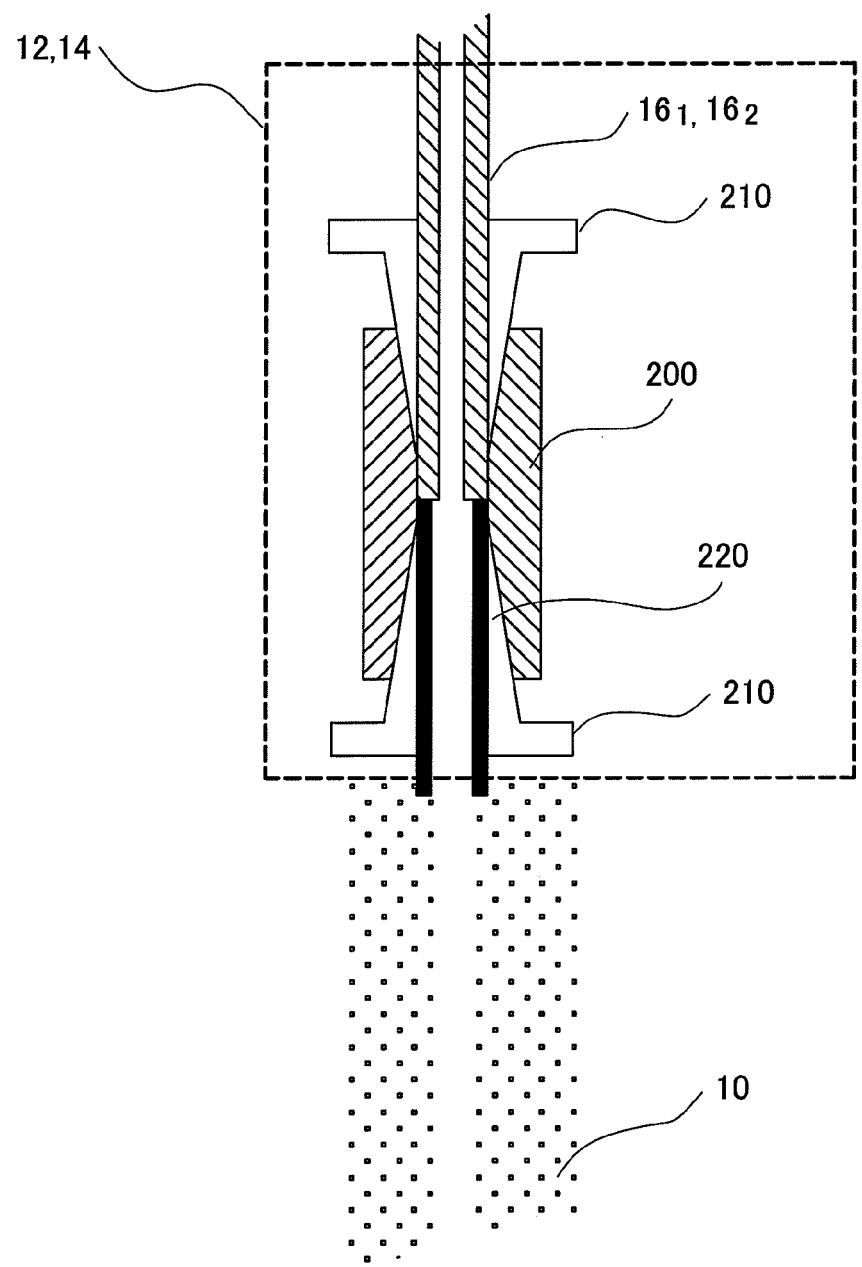
FIG. 2 is a schematic view of a connection between a sample holding vessel and a sample transfer tubing.

The container 10 and sample transfer tubing 16$_2$ are connected at a connection portion 12, while the container 10 and the sample transfer tubing 16$_1$ are connected at a connection portion 14. They are connected by utilizing a pushing pressure to keep the hermetic sealing of the container. One example of the connection form is illustrated in FIG. 2. The container 10 has a narrow tube 220 and this narrow tube 220 is connected to the sample transfer tubing 16$_1$ and 16$_2$ at the connection portions 12 and 14. The connection portions 12 and 14 are each made of a connector 200 and fitting 210. Connection tools typically employed in HPLC are preferred. The fitting 200 has two types, that is, integrated one and that separated into nut and ferrule, but either one is suited for connection. The connector 200 and fitting 210 are made of preferably PEEK, PTEF, Kel-F, Tefzel or other materials known in the field of HPLC. The narrow tube 220 of the container 10 has preferably a similar outer diameter to that of the sample transfer tubing and desirably falls within a range of from 1.57 mm to 0.36 mm.

A preferred embodiment of NMR measurement carried out by adjusting the conditions of a small molecule solution and injecting a large molecule solution under predetermined conditions will next be described in accordance with FIG. 3.

After starting 100 of measurement, degassing 102 of pure water and buffer solution to be injected is carried out. Degassing of the water or solution may be carried out by installing a degasser at the injection valve 46 or feed pump 48 and removing dissolved oxygen from the water or solution passing through the degasser, or by preliminary reducing the pressure of the water or solution to be injected and causing generation of air bubbles therefrom. For degassing by pressure reduction, it is recommended to connect an aspirator, for example, that manufactured by Tokyo Rikakikai to a pressure vessel such as an eggplant flask having the water or solution charged therein, dip the flask in a ultrasonic bath "B-220H" manufactured by Branson, and expose it to ultrasonic waves for 60 minutes.

Injection 104 of the pure water into a circulation route is performed in the following manner.

A vessel containing the degassed pure water is connected to the injection valve 46. By means of the feed pump 48, it is sucked, discharged from the discharge port 42, and fed to the transfer tubing 18$_1$. During feeding, the discharge valve 44 is opened, while the injection port 52 and discharge port 62 for the large molecule solution is closed. The pure water is fed to the mixing filter portion 32 via the first small molecule solution transfer tubing $18_1$. At the mixing filter portion 32, it passes through the portions $55_1$ and $55_2$ through which only a small molecule solution passes and the hollow filters $54_1$ and $54_2$, reaches the portion 56 through which a mixed solution passes, is discharged from the discharge port 50, passes through the first sample transfer tubing $16_1$, and reaches the container 10. Then, the pure water passes through the second sample transfer tubing $16_2$, separating filter portion 34, and second small molecule solution transfer tubing $18_2$, reaches the discharge valve 44 of the control portion 30, and is discharged outside. Until mixing of air bubbles in the pure water discharged from the discharge valve 44 stops, supply of the pure water is continued. When the discharge valve 44 is closed without stopping the injection of the pure water from the injection valve 46, the pure water reaches the input side of the feed pump 48, leading to a pressure rise. When the pump 48 is thereafter once stopped and the injection valve 46 is closed, the whole of the sample passage regions in the container 10 set in the probe 24, sample transfer tubings $16_1$, $16_2$, $18_1$, and $18_2$, filter portions 32 and 34, and the control portion 30 is filled with the pure water.

Exchange 106 of the pure water with the buffer solution is performed in the following manner.

A vessel containing the buffer solution which has completed the degassing treatment 102 is connected to the injection valve 46, followed by similar operations to those employed in the injection 104 of pure water, whereby the whole of the sample passing regions in the container 10 set in the probe 24, sample transfer tubings $16_1$, $16_2$, $18_1$, and $18_2$, filter portions 32 and 34, and the control portion 30 is filled with the buffer solution.

Injection and concentration control 108 of small molecule solution is performed in the following manner.

First, solution circulation is performed by means of the feed pump 48 to form a flow of the solution in a transfer tubing. A small molecule solution for injection is set in the small molecule solution injection portion 70 and it is injected in an amount determined by a measurer. During injection, the discharge valve 44 is opened. Use of a syringe pump for injection enables precise injection of the solution in an injection amount at an injection rate, each determined by the measurer. The solution thus injected reaches the feed pump 48 with the flow, passes through the first small molecule solution transfer tubing $18_1$ and is fed to the mixing filter portion 32. In the mixing filter portion 32, the small molecule solution is fed from the small molecule solution injection port to the portions $55_1$ and $55_2$ through which only a small molecule solution passes, passes through the hollow filters $54_1$ and $54_2$, and reaches the portion 56 through which a mixed solution passes. During the injection of only the small molecule solution, only the small molecule solution is present in the portion 56 through which a mixed solution passes. The solution discharged from the discharge port 50 reaches the container 10 after passing through the first sample transfer tubing $16_1$. An excess solution which has appeared simultaneously with the injection is discharged from the discharge valve 44. After completion of the discharge of the excess solution, the pressure indicated by a pressure gauge returns to that during the circulation feeding. After confirmation of the returning of this pressure, the discharge valve 44 is closed, followed by steady circulation feeding. The concentration of the small molecule has increased in the sample passing regions in the container 10 set in the probe 24, sample transfer tubings $16_1$, $16_2$, $18_1$, and $18_2$, filter portions 32 and 34, and control portion 30. The inner concentration becomes substantially uniform by carrying out steady circulation feeding about five cycles.

Figure 4:
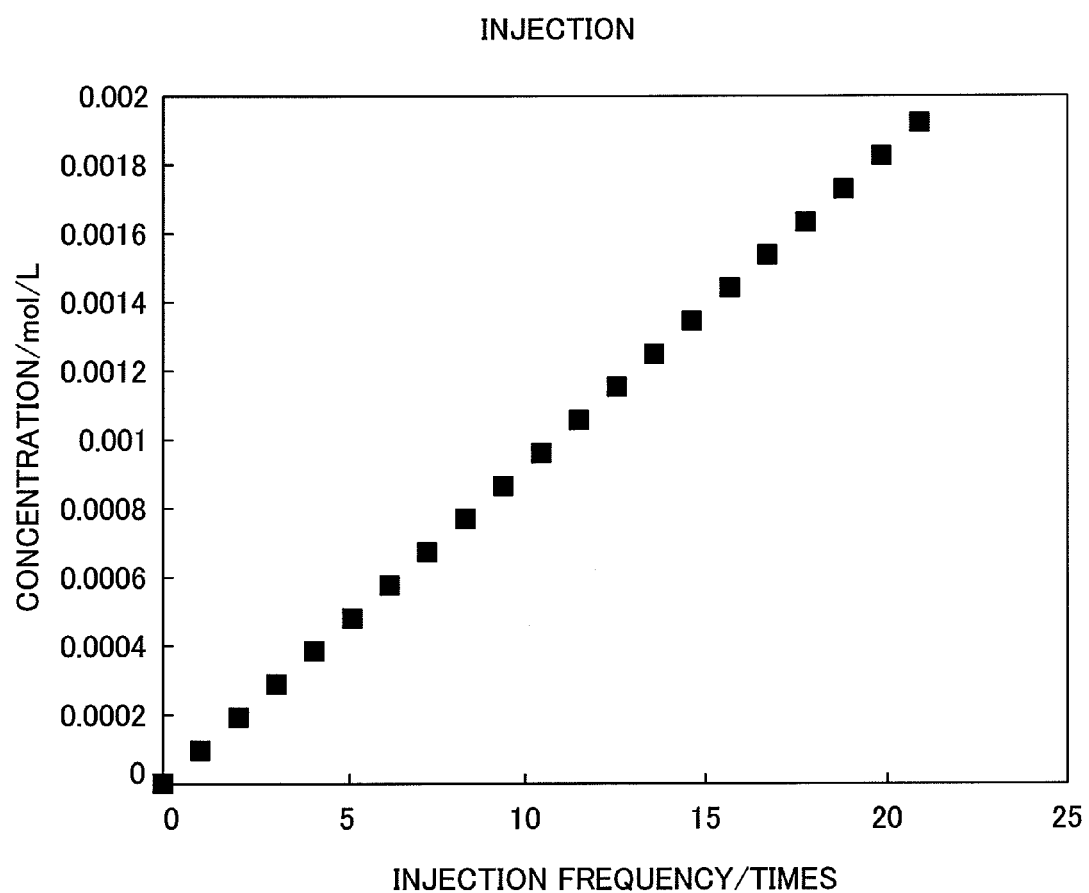
FIG. 4 is a graph showing a change in the concentration of a small molecule in a sample solution caused by plural injection operations of the small molecule according to the present invention.

An increase in the concentration of the small molecule in the sample solution to be used for the NMR measurement can be controlled by conducting the injection operation of the small molecule plural times. Variations in the concentration of the small molecule in the container 10 as a function of injection frequency occur in accordance with the equations (4), (5) and (6). FIG. 4 shows the concentration of the small molecule in the container 10 when the total volume of the sample passing regions in the container 10 set in the probe 24, sample transfer tubings $16_1$, $16_2$, $18_1$ and $18_2$, filter portions 32 and 34 and control portion 30 is 1000 µL, the initial concentration of the small molecule is 0 mol/L, the concentration of the small molecule to be injected by every injection operation is 0.01 mol/L, and the volume of the solution injected from the solution injection portion 70 by single injection operation is 10 µL. With an increase in the injection frequency, the concentration of the small molecule in the container 10 rises. Accordingly, the desired small molecule concentration can be realized by designating the injection concentration, volume and frequency and the NMR measurement is performed at this concentration.

The concentration of a target small molecule in the sample solution used for the NMR measurement can be reduced by repeating the injection operation of, instead of the solution containing a small molecule, only a buffer or a solution not containing a specific small molecule. The concentration of the small molecule in the container 10 varies as a function of injection frequency in accordance with the equations (10), (11) and (12).

Figure 5:
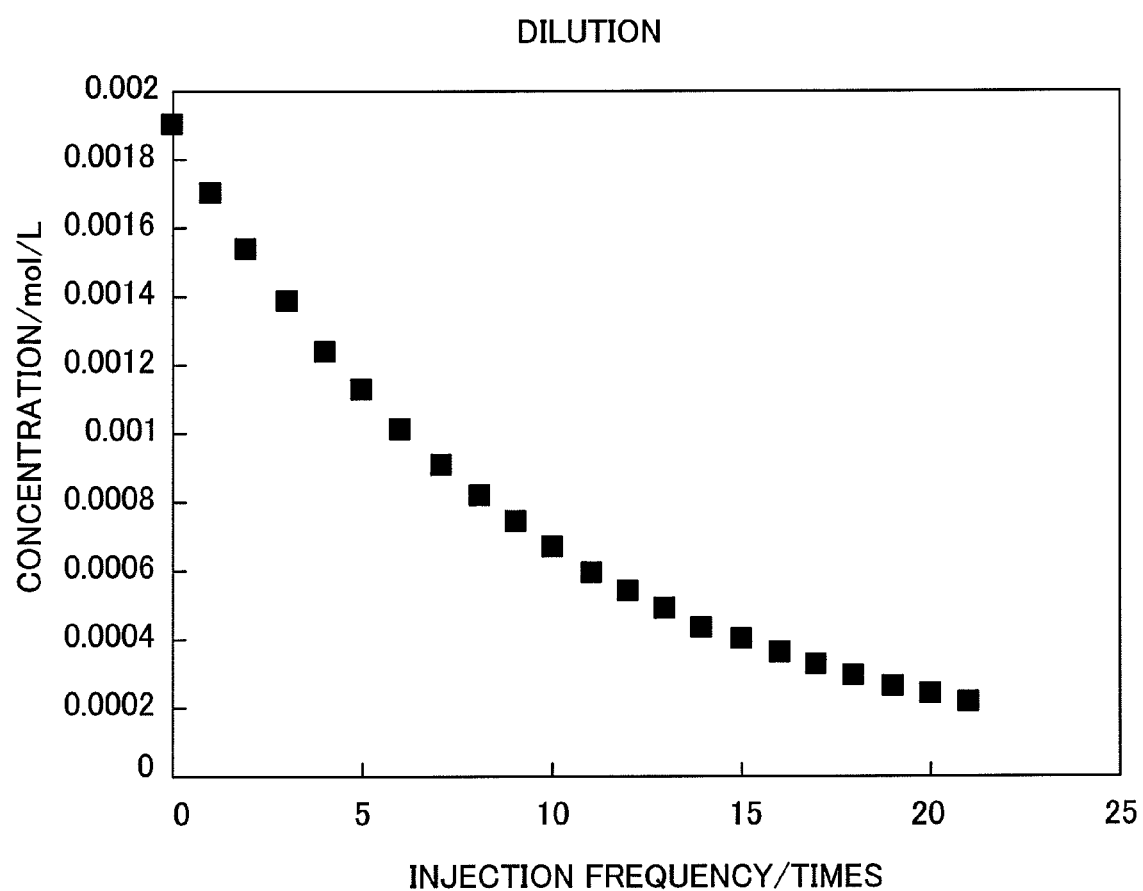
FIG. 5 is a graph showing a change in the concentration of a small molecule in a sample solution caused by plural dilution operations of the small molecule according to the present invention.

FIG. 5 shows the concentration of the small molecule in the container 10 when the total volume of the sample passing regions in the container 10 set in the probe 24, sample transfer tubings $16_1$, $16_2$, $18_1$ and $18_2$, filter portions 32 and 34, and control portion 30 is 1000 µL, the initial concentration of the small molecule is 0.0019 mol/L, the concentration of the small molecule to be injected by every injection operation is 0.00 mol/L, and the volume of the solution injected from the solution injection portion 70 by single injection operation is 100 µL. With an increase in the injection frequency, the concentration of the small molecule in the container 10 decreases. Accordingly, a desired small molecule concentration is realized by designating the volume and operation frequency and the NMR measurement is carried out at this concentration.

By using the operation for increasing the concentration of the small molecule and that for decreasing it in combination, the concentration of the small molecule can be controlled, that is, increased or decreased freely. This suggests that a measurement condition once employed can be used again.

In the injection operation of the solution containing or not containing the small molecule, addition of a lock solvent having a certain concentration to a solution to be injected makes it possible to keep its concentration in the container 10 constant.

The equalization 110 of the concentration 110 is conducted in the following manner.

The concentration can be made almost uniform by carrying out steady circulation feeding about five cycles, but an increase in the circulation frequency enables further equalization of the concentration.

Adjustment of magnetic field homogeneity 112 is conducted in the following manner.

When a lock solvent is added to the small molecule solution in advance, adjustment of magnetic field homogeneity (shimming) can be carried out utilizing a lock signal in the NMR measurement. Shimming can also be performed not using the lock signal but using a signal derived from the small molecule.

The injection and concentration control 120 of the small molecule solution) are carried out in the following manner.

When the concentration of the small molecule is different from the predetermined concentration based on the NMR signal derived from the small compound or measurement of spectrum, the concentration can be controlled by carrying out injection and concentration control 108 of a small molecule solution and equalization 110 of the concentration.

Injection 122 of large molecule solution is performed in the following manner.

The operation of the feed pump 48 is started to generate a certain flow in all the circulation routes in the container 10 set in the probe 24, sample transfer tubings $16_1$, $16_2$, $18_1$ and $18_2$, filter portions 32 and 34 and control portion 30. From the sample solution injection portion 90, the solution containing the large molecule is injected in an amount designated by the measurer. In the portion 56 through which a mixed solution passes, the low molecule solution which has already been present is mixed with the large molecule solution. The hollow filters $54_1$ and $54_2$ do not allow the passage of the large molecule so that the solution containing the large molecule transfers, along the certain flow, to the container 10 set in the probe. Since the container 10 has a larger inner diameter than that of the sample transfer tubings $16_1$ and $16_2$, further mixing of the solution which has passed through the sample transfer tubing $16_1$ occurs in this container 10.

Holding 124 of the sample in the NMR measurement portion is conducted in the following manner.

Since the volume and flow rate of the large molecule solution to be injected, and the volumes of the region 56, transfer tubing 161 and container 10 are already known, the time necessary for filling the container 10 with the mixed solution can be determined from the time that has elapsed after injection. At the time when the container 10 is filled, the feed pump 48 is terminated. By the termination of the pump, pressure acting on the solution decreases and the circulation flow of the solution stops. Since the container 10 has a larger inner diameter than that of the sample transfer tubings $16_1$ and $16_2$, a difference in the resistance to the solution between when it passes through the container 10 and when it passes through sample transfer tubings $16_1$ and $16_2$ enables holding of the solution in the container 10.

NMR measurement 126 is conducted in the following manner.

After the container set in the probe is filled with the sample solution containing the large molecule, NMR measurement of the sample is performed while applying a uniform magnetostatic field to the sample from the magnet.

The discharge 128 of the large molecule solution is performed in the following manner.

The operation of the feed pump 48 is started and a certain flow is generated in all the circulation routes in the container 10 set in the probe 24, sample transfer tubings $16_1$, $16_2$, $18_1$ and $18_2$, filter portions 32 and 34, and control portion 30. With the certain flow thus generated, the mixed solution retained in the container 10 passes through the sample transport tube $16_2$ and reaches the filter 34. The small molecule solution which has passed through the portion 66 through which a mixed solution passes and hollow filters $64_1$ and $64_2$ passes through the 61 and is discharged to the $18_2$. When a sample discharging syringe 91 is connected to the sample discharge port 62 and the sample discharge port 62 is opened, the solution containing the large molecule transfers from the sample discharge port 62 to the sample discharging syringe 91 and the large molecule solution is discharged.

Judgment 130 on whether the repetition of the exchange of the large molecule solution is completed or not is made in the following manner.

It is judged whether measurement is conducted under all the conditions under which the large molecule solution is to be measured or not. One of the judging methods is to record, prior to the measurement, the number of the conditions under which the large molecule solution is to be measured and each time, compare the number of the conditions under which the measurement is performed in practice with the recorded number of the measurement conditions of the large molecule solution. When the measurement has been made under all the measurement conditions of the large molecule solution in practice as a result of judgment, the next procedure, that is, judgment 140 on whether the repetition of a concentration change or exchange of the small molecule solution is completed or not is made. If measurement is not performed under all the conditions, the injection of the large molecule solution and NMR measurement are carried out again, after returning to the concentration control 120 of small molecule solution. When the measurer judges that the repetition is completed, the repetition is terminated.

Judgment 140 on whether the repetition of a concentration change or exchange of the small molecule solution is completed or not is performed in the following manner.

It is judged whether measurement is conducted under all the conditions under which the small molecule solution is to be measured or not. One of the judging methods is to record, prior to the measurement, the number of the conditions (such as frequency of concentration change and kind of the small molecule) under which the small molecule solution is to be measured and each time, compare the number of the conditions under which the measurement is performed in practice with the recorded number of the measurement conditions of the small molecule solution. When measurement has been made under all the measurement conditions of the small molecule solution in practice as a result of judgment, the next procedure, that is, discharge 150 of the small molecule solution is made. If not so, the concentration control of the small molecule is carried out again after returning to the injection 108 of the small molecule and the measurement is carried out in repetition. When the measurer judges that the repetition is completed, the repetition is terminated.

The discharge 150 of the small molecule solution is carried out in the following manner.

The vessel of the buffer solution treated in the degassing procedure 102 is connected to the injection valve 46 and by similar treatment to that employed in the injection 104 of the pure water, the whole of the sample passing regions in the container 10 set in the probe 24, sample transfer tubings $16_1$, $16_2$, $18_1$, and $18_2$, filter portions 32 and 34, and control portion 30 is filled with the buffer solution. The small molecule solution present in the circulation portions is discharged from the discharge valve 44.

Exchange 152 with pure water is carried out in the following manner.

The vessel of the pure water treated in the degassing treatment 102 is connected to the injection valve 46 and by similar treatment to that employed in the injection 104 of the pure water, the whole of the sample passing regions in the container 10 set in the probe 24, sample transfer tubings $16_1$, $16_2$, $18_1$, and $18_2$, filter portions 32 and 34, and control portion 30 which are circulation portions is filled with the pure water. The buffer solution is discharged from the discharge valve 44.

Some of the samples need mixing of a lock solvent therein at the time of NMR measurement. When a large portion of the solvent is light water such as a phosphate buffer employed frequently for the NMR measurement of a protein, use of deuterated water as a lock solvent is preferred. A preferred concentration of deuterated water is from 5 to 10%.

Measurement using a preferred solvent such as buffer solvent or lock solvent selected depending on the large molecule to be measured is also within the scope of the Example of the present invention.

A magnetic field B0 is applied from the magnet 20 to a lock-solvent-containing sample solution in the container 10 to effect magnetic field locking. The uniformity of the magnetic field B0 for enabling the NMR measurement can be maintained by utilizing the magnetic field locking for controlling the uniformity of the magnetic field B0 generated from the magnet 20.

It is known that proteins, among large molecules, have a property of undergoing an enzymatic reaction. This enzymatic reaction is a reaction of changing a substrate into a product with a protein as a catalyst and the protein reacts only with a specific substrate. This reaction is inhibited by a compound called "inhibitor". Inhibitors are compounds controlling the enzymatic reaction of proteins and search of them is industrially useful.

In the research and development of inhibitors, it is necessary to study the interaction between a protein and a small molecule, elucidate their binding state, and develop a small molecule having a stronger binding performance.

In order to study the interaction between a protein and a small molecule, it is useful to study not the interaction with one protein but the interaction between a plurality of proteins, each obtained by modifying a specific residue of the protein whose active site (binding site to the compound, substrate) has been subjected to activation/deactivation control, and a small molecule while varying the kind or concentration of the small molecule.

According to the present invention, the interaction with a plurality of proteins can be analyzed efficiently by means of NMR measurement. In accordance with the procedures as described above in FIG. 3, a specific small molecule solution is injected in the procedure 108. After the solution conditions are fixed, a protein solution is injected in the procedure 122, held in the container 10 in the procedure 124, and then NMR measurement is performed.

A pulse sequence which is used for a small molecule solution or protein solution can also be applied to the NMR measurement.

When a change in chemical shift value or line width of a peak derived from a small molecule is to be measured and a solvent contains a water molecule ($H_2O$), proton one-dimensional measurement using WATERGATE, DPFGSE or Water-Flipback method capable of controlling a signal from the water molecule and efficiently detecting a signal derived from a target protein is suited. When the solvent does not contain a water molecule ($H_2O$), on the other hand, use of WATERGATE, DPFGSE or Water-Flipback method is not required.

When correlation between peaks derived from a small molecule is measured and a solvent contains a water molecule ($H_2O$), proton COSY, NOESY or TOCSY measurement using WATERGATE, DPFGSE or Water-Flipback method capable of controlling a signal from the water molecule and efficiently detecting a signal derived from a target protein is suited. When the solvent does not contain a water molecule ($H_2O$), use of WATERGATE, DPFGSE or Water-Flipback method is not required.

When correlation between the peaks derived from an isotopically modified protein such as $^{13}C$ or $^{15}N$ and the solvent contains a water molecule ($H_2O$), HSQC or HMQC measurement using WATERGATE, DPFGSE or Water-Flipback method capable of controlling a signal from the water molecule and efficiently detecting a signal derived from a target protein is suited. Use of a method of measuring heteronuclear correlation, as well as HSQC and HMQC measurements, is also embraced in the present invention. When the solvent does not contain a water molecule ($H_2O$), use of WATERGATE, DPFGSE or Water-Flipback method is not required.

After the NMR measurement, the protein is discharged in the procedure 128, preparation for injection of another protein is performed in the procedure 120, and the protein is injected in the procedure 122.

In the method of the present invention where proteins are exchanged successively in a small molecule solution under certain conditions, it is not necessary to fill the whole circulation route with a protein solution so that the protein amount to be measured can be limited to an amount necessary for the NMR measurement. The term "amount necessary for the NMR measurement" means an amount necessary for keeping the magnetic field of the solution in the container 10 uniform and being detected by a probe coil 28 placed in the NMR probe 24.

In the present invention, the concentration of a small molecule can be increased or diluted so that a measurer can control the conditions of the solution during measurement and set them efficiently. Even if the concentration condition suited for the effect for a large molecule is unknown, the condition can be controlled while carrying out measurement. It is therefore possible to carry out measurement within a concentration range suited for measurement of correlation without preparing a plurality of samples corresponding to a wide range of concentration change.

EXAMPLE 2

A preferred example relating to the finding of association or aggregation conditions of a protein under various solution conditions will next be explained.

Protein is known to cause association, depending on the pH, temperature or concentration of a small molecule in the solution thereof. Association or aggregation of a protein causes a change in its protein function and sometimes leads to appearance of a new activity. A change in the protein due to aggregation can be detected as a spectrum change determined by the NMR measurement.

A concentration condition of a small molecule that causes association or aggregation of a protein, which occurs due to a difference in the concentration of a small molecule, can be found by using the system or procedure as described in Example 1. For example, lysozyme is known to cause aggregation in the presence of an amino acid such as arginine. In order to study the action of a specific small molecule against a single kind of a protein, injection of an amino acid such as arginine is carried out in the procedure of injection and concentration control 108 of a small molecule as described in FIG. 3.

Figure 3:
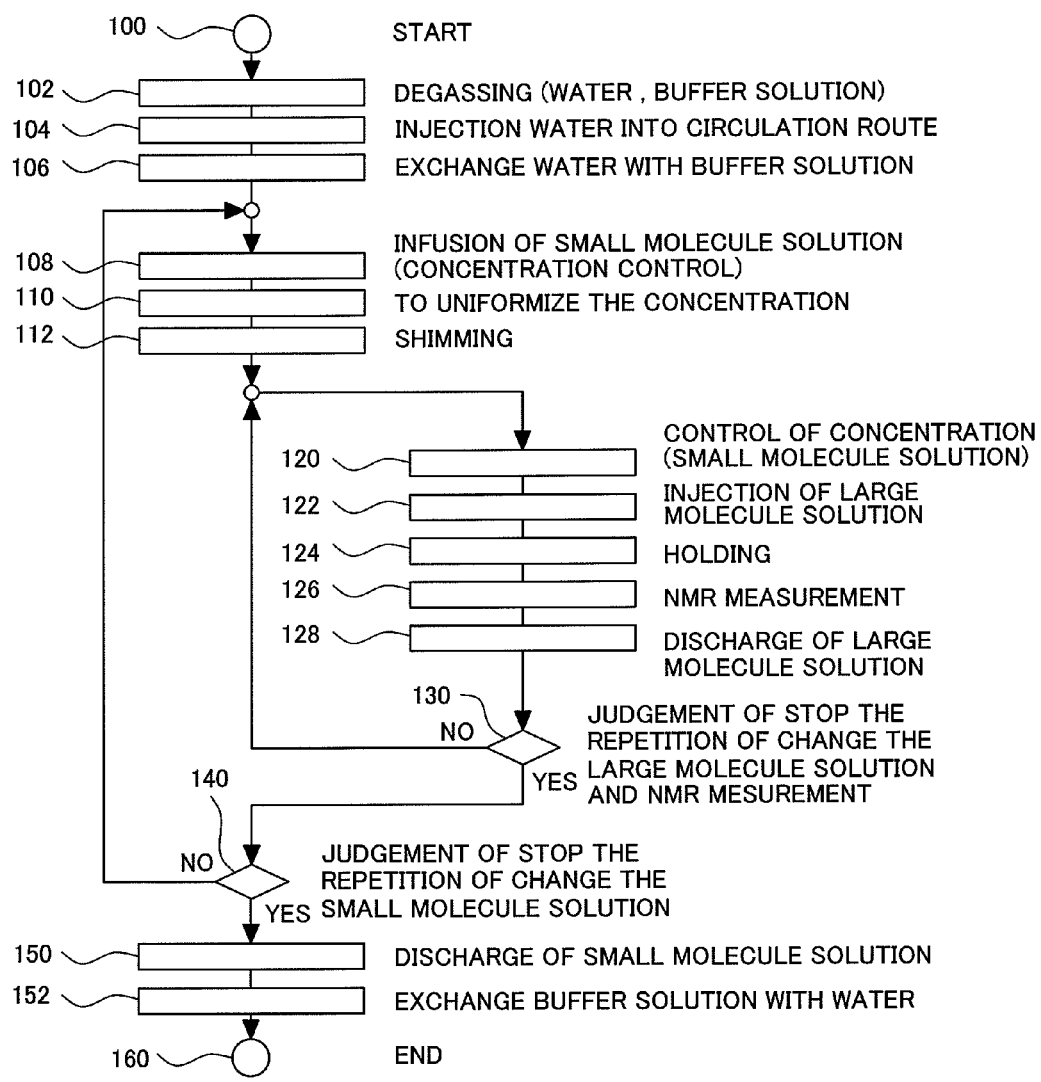
FIG. 3 is a flow chart of the measurement procedures according to the present invention.

Then, subsequent procedures for measurement are performed in accordance with FIG. 3 and in the procedure 122 of injecting a large molecule solution, a target protein is injected.

In the NMR measurement 126 for determining the association or aggregation state, proton one-dimensional measurement using a WATERGATE, DPFGSE or Water-Flipback method capable of controlling a signal from a water molecule (H$_2$O) of the solvent and efficiently detecting a signal derived from the target protein is suited. When the solvent does not contain a water molecule (H$_2$O), use of the WATERGATE, DPFGSE or Water-Flipback method is not required.

The line width and height of the peak derived from the target protein on the NMR spectrum thus obtained are recorded for each condition of the small molecule solution.

When association or aggregation of proteins occurs, plural proteins which have so far moved in a solution as each molecule start moving in the bound form. This leads to an increase in the mass relative to the movement, slower random movement in the solution, increase in the line width of a peak derived from the protein, and reduction in the peak height.

It is judged based on the data recorded in advance whether an increase in the peak linewidth or decrease in the height occurs as a function of the concentration of the small molecule or not. The concentration of the small molecule at which a change starts is the solution condition for causing association or aggregation of the protein.

Measurement of not only a solution of a single protein but also a solution of plural proteins is embraced in this Example.

Measurement of plural protein solutions and plural small molecule solutions is also embraced in this Example.

EXAMPLE 3

Figure 6:
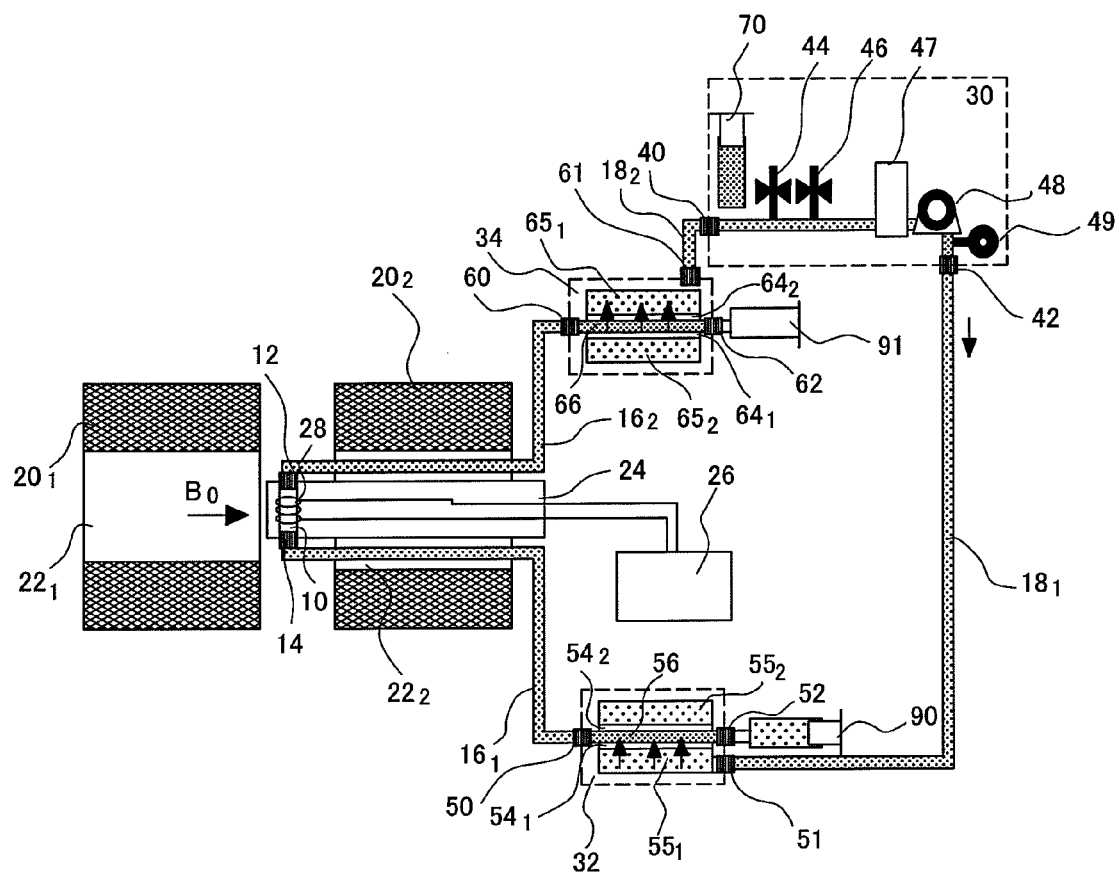
FIG. 6 is a schematic view of a circulation flow type NMR apparatus according to a preferred embodiment of the present invention which has a similar constitution to that of FIG. 1 except that the sample transfer tubing is inserted into the magnet in parallel with the probe.

In another embodiment of the present invention, as illustrated in FIG. 6, the injection port 14 and discharge port 12 are located outside the probe 24, the first sample transfer tubing 16$_1$ and the second sample transfer tubing 16$_2$ are located in a direction perpendicular to the container 10, the first sample transfer tubing 16$_1$ and the second sample transfer tubing 16$_2$ are located inside the bore 22$_2$ and along the nuclear magnetic resonance probe 24 and introduced outside of the magnet 20 from the probe insertion port of the bore 22$_2$. In such an embodiment, it is possible to decrease the length of the first sample transfer tubing 16$_1$ and the second sample transfer tubing 16$_2$ and not to insert them in the probe having only a limited internal space.

EXAMPLE 4

Figure 7:
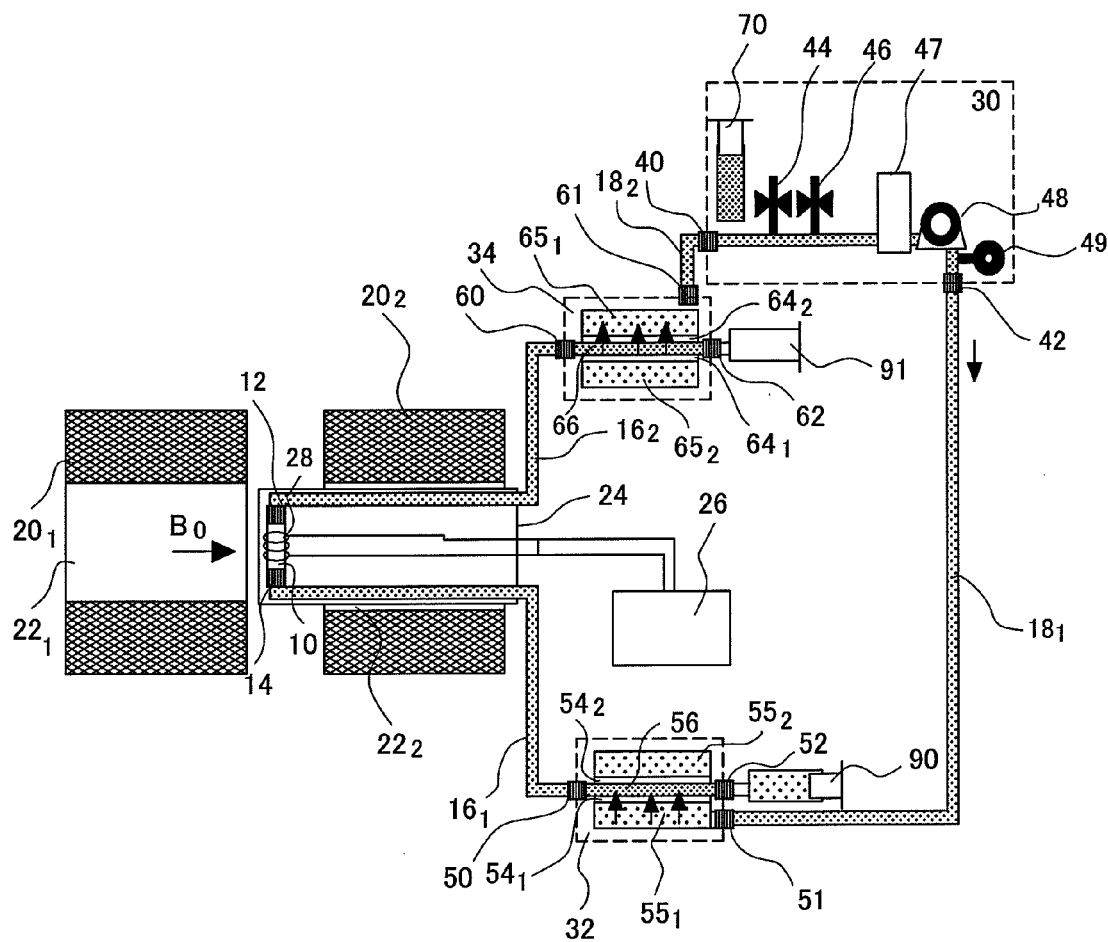
FIG. 7 is a schematic view of a circulation flow type NMR apparatus according to another preferred embodiment of the present invention which has a similar constitution to that of FIG. 1 except that the sample transfer tubing is placed inside the probe.

In a further embodiment, as illustrated in FIG. 7, the injection port 14 and discharge port 12 are placed inside of the probe 24, the first sample transfer tubing 16$_1$ and the second sample transfer tubing 16$_2$ are located in a direction perpendicular to the container 10 and the first sample transfer tubing 16$_1$ and the second sample transfer tubing 16$_2$ are introduced outside of the magnet 20 after allowing them to pass through the inside of the probe 24. In such an embodiment, it is possible to decrease the length of the first sample transfer tubing 16$_1$ and the second sample transfer tubing 16$_2$ and integrate the probe with sample transfer tubings.

EXAMPLE 5

Figure 8:
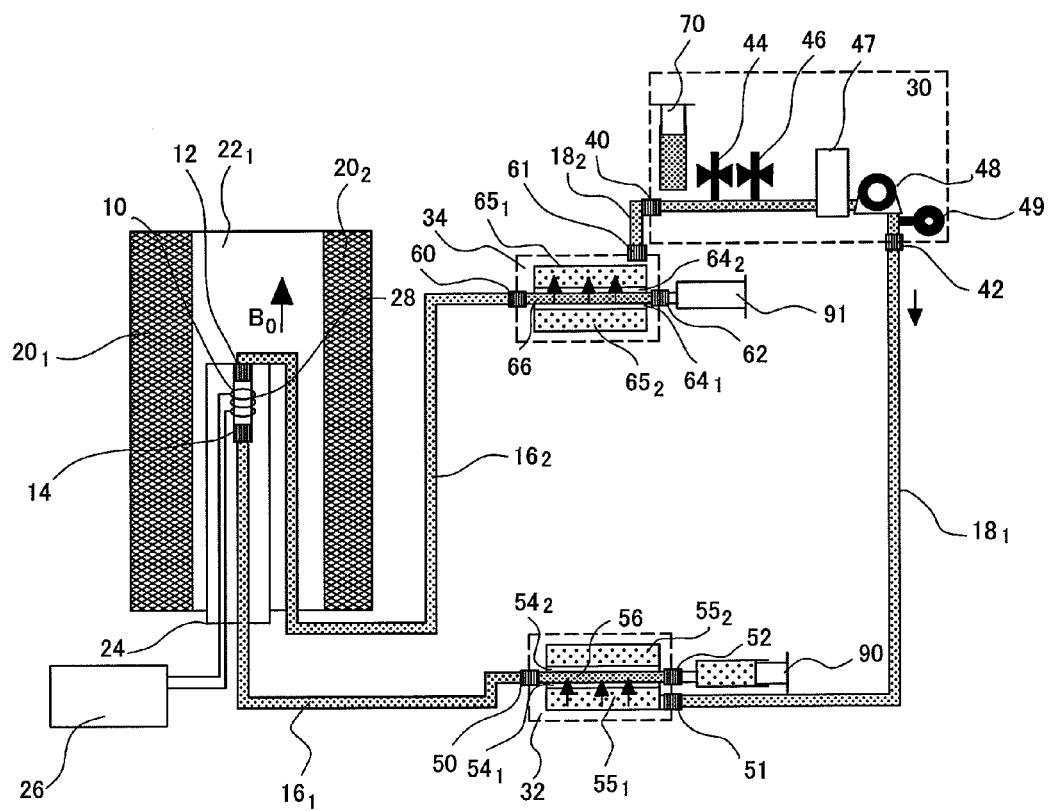
FIG. 8 is a schematic view of a circulation flow type NMR apparatus according to a further preferred embodiment of the present invention in which the sample transfer tubing on one side of a vertical magnet is placed inside the probe.

In a still further embodiment, as illustrated in FIG. 8, the second sample transfer tubing 16$_2$ is placed inside the bore 22 and the first sample transfer tubing 16$_1$ is placed inside of the probe 24 and the first sample transfer tubing 16$_1$ and the second sample transfer tubing 16$_2$ are connected to the container 10 at the injection port 14 and discharge port 12.

EXAMPLE 6

Figure 9:
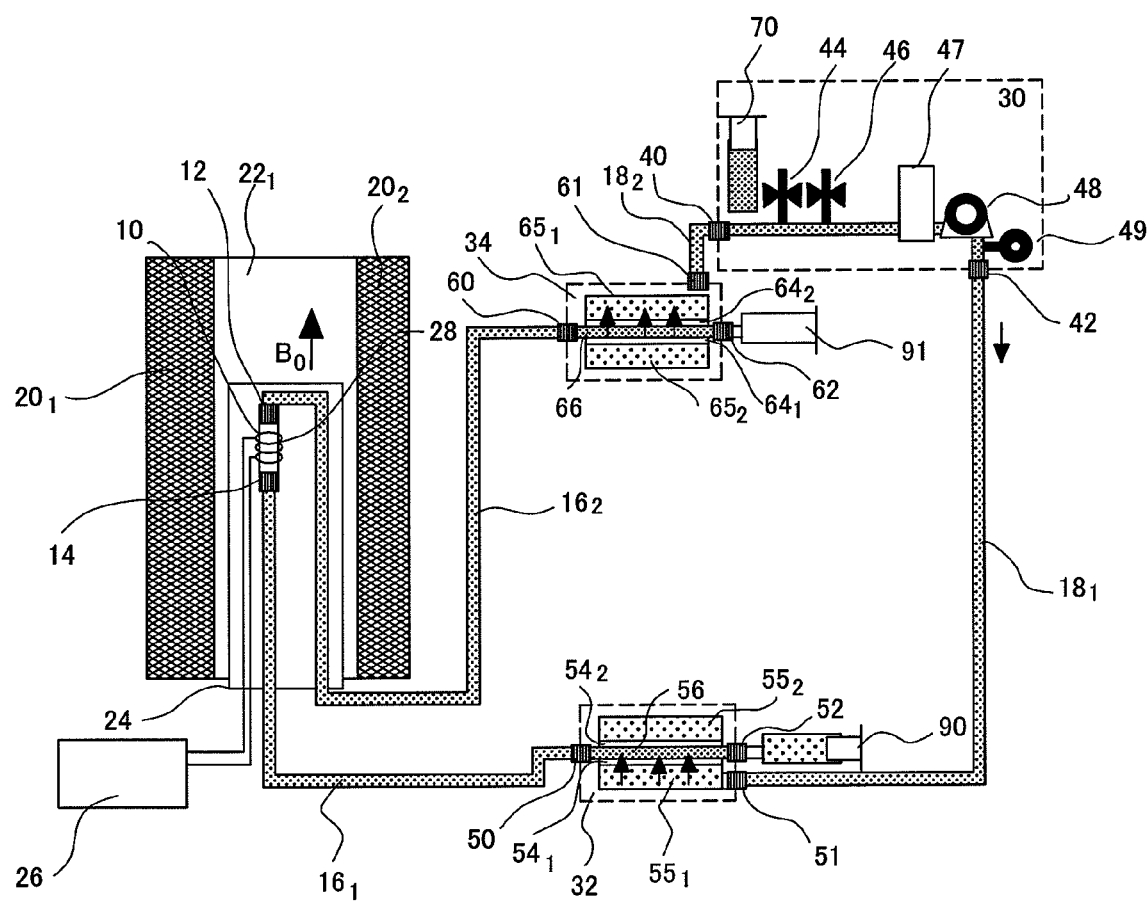
FIG. 9 is a schematic view of a circulation flow type NMR apparatus according to a still further preferred embodiment of the present invention which has a similar constitution to that of FIG. 8 except that the sample transfer tubing is placed inside the probe.

In a still further embodiment, as illustrated in FIG. 9, the first sample transfer tubing 16$_1$ and the second sample transfer tubing 16$_2$ are placed inside the probe 24 and at the injection port 14 and discharge port 12, the first sample transfer tubing 16$_1$ and the second sample transfer tubing 16$_2$ are connected to the container 10. In such an embodiment, the probe can be integrated with the container 10 and sample transfer tubings.

EXAMPLE 7

Figure 10:
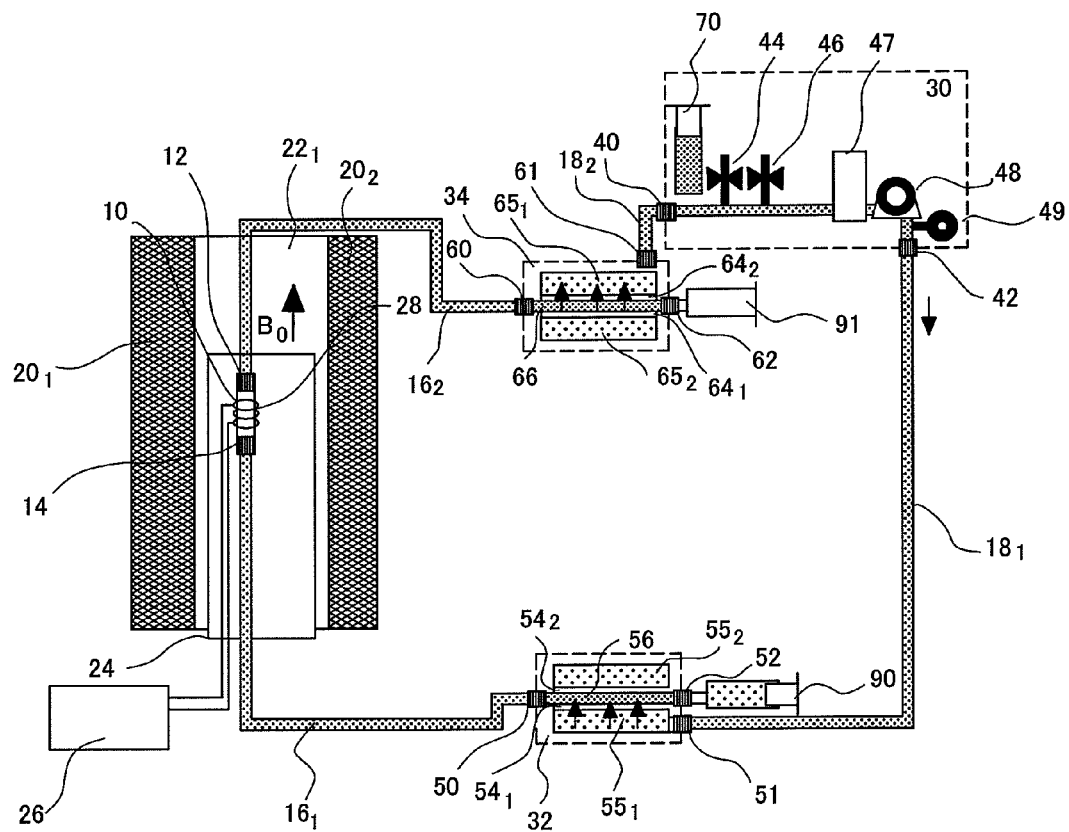
FIG. 10 is a schematic view of a circulation flow type NMR apparatus according to a still further preferred embodiment of the present invention which has a similar constitution to that of FIG. 8 except that the sample transfer tubing is placed so as to penetrate the magnet from the upper portion to the lower portion thereof.

In a still further embodiment, as illustrated in FIG. 10, the second sample transfer tubing 16$_2$ is inserted from the upper opening portion of the bore 22$_1$, the first sample transfer tubing 16$_1$ is placed inside the probe 24, and the first sample transfer tubing 16$_1$ and the second sample transfer tubing 16$_2$ are connected to the container 10 at the injection port 14 and discharge port 12.

The constitutions of the present invention other than those described above will next be described.

(1) An apparatus for nuclear magnetic resonance measurement, which is equipped with a measurement portion having a magnet for applying a magnetic field to a sample, a bore placed inside the magnet, a nuclear magnetic resonance probe placed in the bore, and a container for retaining the sample therein, which container is installed in the nuclear magnetic resonance probe and has an injection port and a discharge port of the sample; a mixing filter portion for mixing a small molecule solution with a sample solution which has a first sample transfer tubing connected to the injection port of the container, a second sample transfer tubing connected to the discharge port of the container, an injection port of the small molecule solution, and an injection port and discharge port of the sample, the discharge port being connected to the first sample transfer tubing; a separating filter portion for separating the small molecule solution not containing the sample from the mixed solution of the small molecule and sample, which filter portion has a first small molecule solution transfer tubing connected to the small molecule solution injection port of the mixing filter portion, a small molecule discharge port, and a discharge port and injection port of the sample, the injection port of the sample being connected to the second sample transfer tubing; a small molecule concentration controlling portion for controlling the concentration of the small molecule and feeding the small molecule solution, which portion has a second small molecule solution transfer tubing connected to the small molecule discharge port of the separating filter portion and an injection port and discharge port of the small molecule solution, the injection port being connected to the second small molecule solution transfer tubing and the discharge port being connected to the first small molecule solution transfer tubing; a transmitter/receiver system for transmitting an electromagnetic wave to the nuclear magnetic resonance probe or receiving an electromagnetic wave from the nuclear magnetic resonance probe; a unit for carrying out circulation solution transfer among the small molecule concentration control portion, first small molecule solution transfer tubing, mixing filter portion, first sample transfer tubing, container, second sample transfer tubing, separating filter portion and second small molecule solution transfer tubing; a unit for injecting the small molecule solution; a unit for controlling the small molecule concentration; a unit for injecting the sample solution; a unit for holding the sample solution in the measurement portion; a unit for discharging the sample solution; and a unit for carrying out nuclear magnetic resonance measurement of the sample solution.

(2) An apparatus as described above in (1), wherein the container has an NMR measurement portion having a larger diameter than those of the first and second sample transfer tubings.

(3) An apparatus as described above in (1), wherein the mixing filter portion has a portion through which the mixed solution of the sample with the small molecule separated by a hollow filter substance through which only the small molecule solution can pass passes, a portion through which only the small molecule solution passes, the injection port of the small molecule solution, the injection port of the sample, and a discharge port for discharging the mixed solution; and the separating filter portion has a portion through which the mixed solution of the sample with the small molecule separated by a hollow filter substance through which only the small molecule solution can pass passes, a portion through which only the small molecule solution passes, an injection port of the mixed solution, the discharge port of the sample and the discharge port of the small molecule solution.

(4) An apparatus as described above in (1), wherein in the small molecule concentration control portion, the injection port of the small molecule concentration control portion is connected to the small molecule solution injection portion, discharge valve, injection valve, feed pump, pressure gauge and discharge port of the small molecule concentration control portion; the small molecule solution injection portion has one or more syringe pumps, and injection from the syringe pump is controlled by an electronic appliance for controlling the syringe pump; and the feed pump portion has an injection port to which a degasser can be attached, a pump for feeding the solution under pressure, and an electronic appliance for controlling the pump.

(5) An apparatus as described above in (1), wherein in the unit for carrying out circulation solution transfer, the solution pressurized at the feed pump portion is discharged from the discharge port of the small molecule concentration control portion, passes through the first small molecule solution transfer tubing, reaches the small molecule solution injection port of the mixing filter portion, passes through the hollow filter substance at the mixing filter portion, is discharged from the discharge port, passes through the first sample transfer tubing, reaches the container, passes through the second sample transfer tubing, passes through the injection port of the separating filter portion, the hollow filter substance at the separating filter portion, and the second small molecule solution transfer tubing, and reaches the injection port of the small molecule concentration control portion.

(6) An apparatus as described above in (1), wherein the unit for injecting the small molecule solution injects a solution containing the small molecule from the small molecule solution injection portion of the small molecule concentration control portion while carrying out circulation solution transfer and discharges the solution from the discharge valve until the value of the pressure gauge returns to that under a steady circulation state.

(7) An apparatus as described above in (1), wherein the unit for controlling the small molecule concentration is a unit for increasing the small molecule concentration in the container by injecting the small molecule solution from the small molecule solution injection portion of the small molecule concentration control portion and discharging an excess solution depending on the volume of the small molecule solution thus injected; or decreasing the small molecule concentration in the container by injecting a solution not containing the small molecule from the small molecule solution injection portion and discharging an excess solution depending on the injected volume.

(8) An apparatus as described above in (1), wherein the unit for injecting the sample solution feeds the sample solution to a portion of the mixing filter portion through which the mixed solution of the small molecule and sample passes by pressurizing with a syringe or the like attached to the sample injection port of the mixing filter portion while carrying out the circulation solution transfer and then feeds the sample to the container in accordance with a method of circulation transfer of a solution.

(9) An apparatus as described above in (1), wherein in the unit for holding the sample solution in the measurement portion, the sample solution is held in the NMR measurement portion of the container by terminating the pressurization of the feed pump when the sample reaches the NMR measurement portion of the container by circulation solution transfer.

(10) An apparatus as described above in (1), wherein in the unit for discharging the sample solution, the circulation solution transfer is caused by starting the feeding of the solution under pressure of the feed pump, the sample-containing mixed solution is separated at the separating filter portion into a sample-containing solution and a sample-free small molecule solution, and the sample-containing solution is taken out from the discharge port of the separating filter portion.

(11) An apparatus as described above in (1), wherein after controlling the small molecule concentration in the container by using the unit for injecting the small molecule solution and the unit for controlling the small molecule concentration, the unit for carrying out nuclear magnetic resonance measurement of the sample solution holds the sample in the NMR measurement portion by means of the unit for injecting the sample solution and the unit for holding the sample solution in the measurement portion, carries out nuclear magnetic resonance measurement, and after the measurement, discharges the sample by making use of the unit for discharging the sample solution.

Application of the present invention to large molecules, such as protein, having a function in the living body enables repetition of NMR measurement while maintaining a constant volume of the sample in the NMR measurement region and changing the solution conditions and large molecule efficiently. In the fields of life science, it contributes to the improvement in the efficiency of analysis of biochemical processes occurring in the living body, while in the medical or drug discovery fields, it contributes to the improvement in the efficiency of disease mechanism analysis or screening by measuring the binding strength with the disease-related protein.

Reference numerals used in the drawings of the present application will be explained below.

What is claimed is:

1. An apparatus of nuclear magnetic resonance measurement by using circulation flow for sample condition control, comprising:

a magnet for applying a magnetic field to a sample to be measured;

a bore placed at a hollow portion of the magnet;

a nuclear magnetic resonance probe, at least a portion of which is placed in the bore;

an NMR measurement portion placed at a portion of the nuclear magnetic resonance probe and equipped with a container having a sample injection port for injecting the sample and a sample discharge port for discharging the sample;

a first sample transfer tubing connected to the sample injection port for transferring the sample to the NMR measurement portion;

a mixing filter portion connected to the first sample transfer tubing for mixing a sample solution with a small molecule solution to prepare the sample; and a receiver/transmitter apparatus for transmitting an electromagnetic wave to the NMR measurement portion or receiving an electromagnetic wave from the nuclear magnetic resonance probe, wherein nuclear magnetic resonance measurement is performed by irradiating the electromagnetic wave to the sample injected into the NMR measurement portion via the first sample transfer tubing connected to the mixing filter portion.

2. The apparatus of nuclear magnetic resonance measurement by using circulation flow for sample condition control according to claim 1, wherein the inner diameter of the first sample transfer tubing is less than that of a container constituting the NMR measurement portion.

3. The apparatus of nuclear magnetic resonance measurement by using circulation flow for sample condition control according to claim 1, wherein a ratio of the inner diameter of a container constituting the NMR measurement portion to the inner diameter of the first sample transfer tubing is 6.0 or greater but not greater than 77.0.

4. The apparatus of nuclear magnetic resonance measurement by using circulation flow for sample condition control according to claim 1, wherein the mixing filter portion has:
  a first mixing solution passing portion through which the sample obtained by mixing the small molecule solution with the sample solution passes;
  a first filter which is placed in contact with at least a portion of the first mixing solution passing portion so as to encompass the at least a portion with the first filter and does not permits passage of substances other than the small molecule solution; and
  a first small molecule solution transfer portion placed in contact with at least one portion of the first filter so as to encompass the at least one portion with the transfer portion for transferring the small molecule solution, wherein the first mixing solution passing portion has:
  a sample solution injection port attached to one end of the passing portion for injecting the sample solution;
  a mixing solution discharge port attached to the other end and connected to the first sample transfer tubing for discharging the mixing solution; and
  a first small molecule solution injection port placed between the one end and the other end for injecting the small molecule solution.

5. The apparatus of nuclear magnetic resonance measurement by using circulation flow for sample condition control according to claim 1, wherein the injection into the NMR measurement portion is performed by feeding the sample solution to the mixed solution passing portion by pressurizing with an injection unit placed at the sample solution injection port while injecting the small molecule solution from the first small molecule solution injection port and feeding the sample obtained by mixing the sample solution with the small molecule solution at the mixed solution passing portion to the container with the flow of a conveyance solution for conveying the sample.

6. The apparatus of nuclear magnetic resonance measurement by using circulation flow for sample condition control according to claim 1, wherein the nuclear magnetic resonance measurement is performed by:
detecting, by using the nuclear magnetic resonance probe, a nuclear magnetic resonance signal emitted from the sample as a result of the irradiation of an electromagnetic wave while holding the sample in the NMR measurement portion, and after completion of the detection, discharging the sample from a container of the NMR measurement portion.

7. The apparatus of nuclear magnetic resonance measurement by using circulation flow for sample condition control according to claim 6, wherein the holding of the sample in the container of the NMR measurement portion is performed by:
injecting the small molecule solution from the first small molecule solution injection port, and terminating the flow of the conveyance solution when the container of the NMR measurement portion is filled with the sample.

8. The apparatus of nuclear magnetic resonance measurement by using circulation flow for sample condition control according to claim 6, wherein the discharge of the sample from the container of the NMR measurement portion is performed by injecting the small molecule solution from the first small molecule solution injection port to discharge the sample out of the container.

9. The apparatus of nuclear magnetic resonance measurement by using circulation flow for sample condition control according to claim 1, further comprising:
  a second sample transfer tubing connected to the sample discharge port;
  a separating filter portion connected to the second sample transfer tubing for separating the sample into the sample solution and the small molecule solution; and
  a unit for discharging the sample.

10. The apparatus of nuclear magnetic resonance measurement by using circulation flow for sample condition control according to claim 9, wherein the separating filter portion has:
  a second mixed solution passing portion through which a mixed solution of the small molecule solution and the sample solution passes;
  a second filter which is placed in contact with at least one portion of the mixed solution passing portion so as to encompass the at least one portion with the second filter and does not permit the passage of substances other than the small molecule solution; and
  a second small molecule solution transfer portion placed in contact with at least one portion of the second filter so as to encompass the at least one portion with the transfer portion for transferring the small molecule solution, wherein the second mixed solution passing portion has:
  a sample solution discharge port installed at one end of the solution passing portion for discharging the sample solution;
  a mixed solution injection port attached to the other end of the second mixed solution passing portion and connected to the second sample transfer tubing for injecting the mixed solution; and
  a small molecule solution discharge port placed between the one end and the other end for separating the mixed solution and discharging the small molecule solution.

11. The apparatus of nuclear magnetic resonance measurement by using circulation flow for sample condition control according to claim 9, wherein the discharge of the sample is performed by injecting the small molecule solution from the small molecule solution injection port of the mixing filter portion to separate the mixed solution into the sample-containing solution and the sample-free small molecule solution at the separating filter portion and discharging the sample-containing solution from the sample solution discharge port of the separating filter portion.

12. The apparatus of nuclear magnetic resonance measurement by using circulation flow for sample condition control according to claim 9, further comprising:

a small molecule concentration control portion for controlling the small molecule compound concentration in the mixed solution and feeding the small molecule solution;

a first small molecule solution transfer tubing connected to a discharge port of the small molecule concentration control portion and a small molecule solution injection port of the mixing filter portion;

a second small molecule solution transfer tubing connected to a small molecule solution discharge port of the separating filter portion and an injection port of the small molecule concentration control portion;

a small molecule solution injection unit connected to the small molecule concentration control portion for injecting the small molecule solution; and a conveyance solution injection unit connected to the small molecule concentration control portion for injecting a conveyance solution which conveys the sample solution and small molecule solution, wherein circulation transfer of the small molecule solution is performed by feeding the small molecule solution to the mixing filter portion via the first small molecule solution transfer tubing by means of the small molecule solution injection unit, mixing the small molecule solution with the sample solution in the mixing filter portion, feeding the resulting mixture to the separating filter portion via the NMR measurement portion, and separating the mixture into the sample solution and the small molecule solution by the separating filter portion, and feeding the small molecule solution to the small molecule concentration control portion.

13. The apparatus of nuclear magnetic resonance measurement by using circulation flow for sample condition control according to claim 12, wherein the small molecule concentration control portion has:

an injection port connected to the second small molecule solution transfer tubing for injecting the small molecule solution;

a discharge port for discharging the small molecule solution to the first small molecule solution transfer tubing;

a solution transfer tubing for connecting the injection port and the discharge port;

the small molecule solution injection portion connected to the solution transfer tubing for injecting the small molecule solution;

a discharge valve connected to the solution transfer tubing for controlling the discharge of the small molecule solution;

an injection valve connected to the solution transfer tubing for controlling the injection;

a feed pump for feeding the solution present in the solution transfer tubing under pressure; and a pressure gauge for measuring a flow rate of the solution, wherein: the small molecule solution injection portion is equipped with at least one syringe pump and injection of the small molecule solution from the syringe pump is controlled by an electronic appliance; and the feed pump has an injection port to which a degasser can be attached and is controlled by an electronic appliance.

14. The apparatus of nuclear magnetic resonance measurement by using circulation flow for sample condition control according to claim 12, wherein the sample solution is injected from the sample solution injection port to the first mixed solution passing portion of the mixing filter portion, transferred to the NMR measurement portion via the first sample transfer tubing, injected to the second mixed solution passing portion of the separating filter portion via the second sample transfer tubing, and is recovered after transfer to the sample solution discharge port of the second mixed solution passing portion.

15. The apparatus of nuclear magnetic resonance measurement by using circulation flow for sample condition control according to claim 12, wherein the small molecule solution is injected from the small molecule solution injection portion of the small molecule concentration control portion while carrying out the circulation solution transfer and the solution is discharged from the discharge valve until the value of the pressure gauge returns to the pressure of a steady circulation state.

* * * * *